US012628466B2

(12) United States Patent
Liu et al.

(10) Patent No.: US 12,628,466 B2
(45) Date of Patent: May 12, 2026

(54) ENCAPSULATION PROCESS METHOD FOR WAFER-LEVEL LIGHT-EMITTING DIODE DIES

(71) Applicant: INGENTEC CORPORATION, Miaoli County (TW)

(72) Inventors: Ai-Sen Liu, Miaoli County (TW); Hsiao-Lu Chen, Miaoli County (TW); Yi-Chuan Huang, Miaoli County (TW); Hsiang-An Feng, Miaoli County (TW)

(73) Assignee: Ingentec Corporation, Miaoli County (TW)

( * ) Notice: Subject to any disclaimer, the term of this patent is extended or adjusted under 35 U.S.C. 154(b) by 551 days.

(21) Appl. No.: 18/320,936

(22) Filed: May 19, 2023

(65) Prior Publication Data

US 2024/0304749 A1 Sep. 12, 2024

(30) Foreign Application Priority Data

Mar. 8, 2023 (TW) .................................. 112108395

(51) Int. Cl.
*H10H 20/01* (2025.01)

(52) U.S. Cl.
CPC ......... *H10H 20/01* (2025.01); *H10H 20/0361* (2025.01)

(58) Field of Classification Search
None
See application file for complete search history.

(56) References Cited

U.S. PATENT DOCUMENTS

| | | | | |
|---|---|---|---|---|
| 2006/0055309 A1* | 3/2006 | Ono | ..................... | H01L 25/0753 |
| | | | | 257/E33.059 |
| 2009/0179207 A1* | 7/2009 | Chitnis | ................ | H10H 20/814 |
| | | | | 257/E33.056 |
| 2010/0295077 A1* | 11/2010 | Melman | ............... | H10H 20/851 |
| | | | | 438/33 |
| 2011/0115070 A1* | 5/2011 | Lim | ..................... | H01L 25/0657 |
| | | | | 438/114 |
| 2011/0297980 A1* | 12/2011 | Sugizaki | ................ | H10H 20/84 |
| | | | | 257/E33.056 |
| 2015/0357250 A1* | 12/2015 | Kim | ................... | H10H 20/8506 |
| | | | | 438/7 |

* cited by examiner

*Primary Examiner* — Erik T. K. Peterson
(74) *Attorney, Agent, or Firm* — Rosenberg, Klein & Lee

(57) ABSTRACT

An encapsulation process method for wafer-level light-emitting diode dies is provided, in which a wafer structure having a plurality of light-emitting diode dies thereon is adhered to a temporary substrate, and by sequentially performing a laser cutting and a laser punch-through process, the light-emitting diode die turns to be conductive. Then, a transparent conductive film is sputtered thereon the die, and black matrix photoresist and quantum dot color filter are further disposed for performing a color conversion process. After that, the light-emitting diode dies are divided into package structures, and a glue removal process is used to separate the wafer structure from the temporary substrate, so that the wafer structure can be transferred to a target substrate. By employing the present invention, the conventional carrier board can be omitted, and the packaging yield of the vertical light emitting diode die packages is certainly optimized.

20 Claims, 11 Drawing Sheets

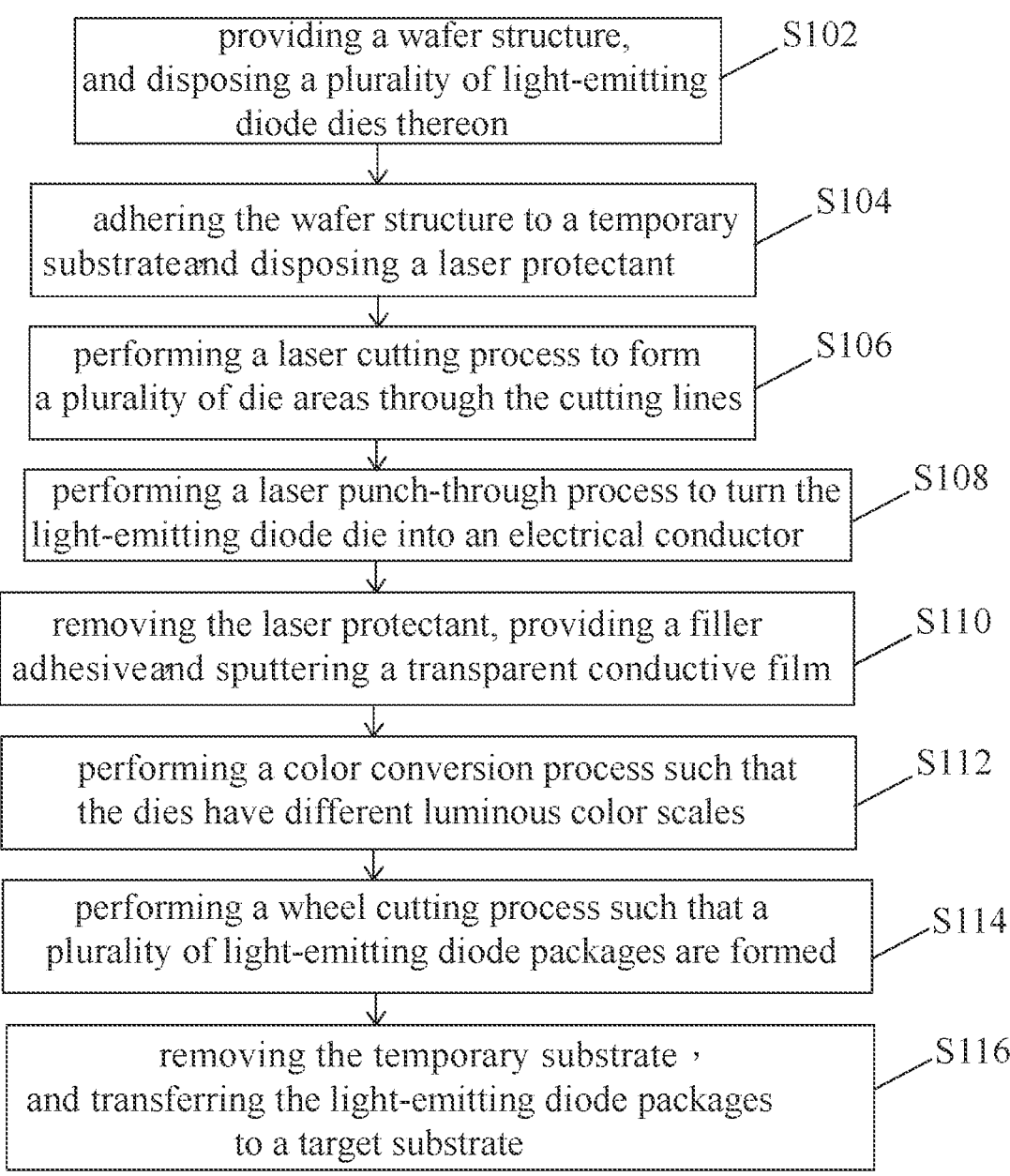

providing a wafer structure,
and disposing a plurality of light-emitting
diode dies thereon — S102 adhering the wafer structure to a temporary
substrate and disposing a laser protectant — S104 performing a laser cutting process to form
a plurality of die areas through the cutting lines — S106 performing a laser punch-through process to turn the
light-emitting diode die into an electrical conductor — S108 removing the laser protectant, providing a filler
adhesive and sputtering a transparent conductive film — S110 performing a color conversion process such that
the dies have different luminous color scales — S112 performing a wheel cutting process such that a
plurality of light-emitting diode packages are formed — S114 removing the temporary substrate ,
and transferring the light-emitting diode packages
to a target substrate — S116

Fig. 1

S112 disposing a plurality of black matrix photoresist — S202 providing at least one quantum dot color filter between the plurality of black matrix photoresist — S204

ENCAPSULATION PROCESS METHOD FOR WAFER-LEVEL LIGHT-EMITTING DIODE DIES

This application claims priority for TW patent application no. 112108395 filed on 8 Mar. 2023, the content of which is incorporated by reference in its entirely.

BACKGROUND OF THE INVENTION

Field of the Invention

The present invention relates to an encapsulation process method for vertical light emitting diode (LED) die package structures. More particularly, the present invention is related to an encapsulation process method for wafer-level light-emitting diode dies without using the conventional carrier board.

Description of the Prior Art

In general, as known, a Light Emitting Diode (LED) is a certain kind of light source which is fabricated using the semiconductor technology and formed by III-V group compound semiconductors. The LEDs normally operate based on a fact that electrons are combined with holes in a semiconductor to produce photons. The LEDs are different from the conventional light bulbs which must work at a high temperature of thousands of degrees. The LEDs are also different from fluorescent lamps which must be using a high voltage to excite an electron beam. Just like a general electronic element, an LED simply requires a voltage of 2~4 V to operate and thus being able to work at a normal temperature environment. While compared with the traditional tungsten light bulbs, it is believed that the LED elements are certainly advantageous of having longer lifetime, higher luminous efficiency, lower failure rate, saving more power, and giving much more stable light. Also, the LED elements are highly compatible with various types of lamp devices. As a result, it is believed that the luminous life of the LED elements is certainly to be much longer than that of the traditional light sources, thereby making the LED elements has successfully become a mainstream commodity in the market nowadays.

Normally, the LED die structures overall, mainly comprise a horizontal-type structure and a vertical-type structure. Regarding a vertical-type structure LED, when compared with the horizontal-type structure LED, it is believed that the vertical-type structure LED is able to provide better reliability in terms of structural strength, photoelectric parameters, thermal characteristics, light decay and cost, etc. And therefore, the vertical-type structure LED has been widely used in the industry nowadays.

And in these years, along with the improvements of the current sciences and technologies, these vertical-type structure LED dies are gradually being mass transferred onto a variety of electronic devices and their substrates thereof. So far, there have been a few conventional techniques, which have been disclosed in the prior arts regarding transferring the dies to the substrate, including: SMT (Surface Mount Technology), wafer-to-wafer transfer technology, electrostatic transfer technology, and so on. However, among these mass transfer technologies, it draws our attention that, the great number of vertical-type structure LED dies configured on the wafer must be cut and divided first. And after that, each die can be individually transferred one by one to the carrier board (usually a printed circuit board) before performing the subsequent encapsulation process of the dies on the carrier board. As such, when the mass transfer process of the dies needs to be carried out in field industries, issues such as redundant process steps, expensive process cost, and poor process efficiency (too slow) often occur in these existing technologies. As a result, these current technologies have been known as being applied limitedly and thus still not being applicable enough until nowadays.

And moreover, when the die structure is transferred onto the carrier board, the die alignment is quite difficult to control and thus can not be accurate even if it was performed by a well-trained human operation or sophisticated transfer technology. And an inaccurate die alignment affects the difficulty and increases the complexity to fix the die in the right position subsequently and may even increase the cost and time for rework.

In addition, when most of the industries in recent years need to perform packaging and encapsulation process of the die structure of the LED elements, the die size is getting miniaturized nowadays. Therefore, due to such a tiny die size, it also makes the subsequent wire bonding process become extremely difficult. And therefore, it not only makes the packaging process of the LED elements much more challenging than before, but also reduces and affects the yield of its encapsulation process. It is believed that a main solution to this issue is: "how to find an effective replacement of the existing external wire bonding process under the circumstance of miniaturization of the LED die size". Such a technical solution is eager to be found and proposed. As a result, it is believed that a major target regarding the prior arts relies on how to continuously improve the existing external wire bonding process, and at the same time to find its alternative solution. In view of the above, it can be obvious that people skilled in the arts are in urgent needs to develop a novel and creative process method, so as to solve the problems existing in the above disclosed prior arts, such that the packaging yield of the light-emitting diode dies can be significantly optimized.

Therefore, on account of above, to overcome the above mentioned problems, it should be obvious that there is indeed an urgent need for the professionals in the field for a novel and inventive process method to be developed that can effectively solve the above-mentioned problems occurring in the prior techniques, so as to optimize the efficiency for mass transferring the light emitting diode dies in a modified manner, especially without using the conventional carrier board. As a result, the Applicants of the present invention observe the above deficiencies to be improved, and thus propose a novel encapsulation process method for wafer-level light-emitting diode dies, especially without using the conventional carrier board. Through the disclosed innovative encapsulation process method, the wafer-level-package (WLP) light-emitting diode die structures can be mass transferred in an optimal result and superior benefits. Hereinafter, the detailed specific implementations will be fully described in the following paragraphs.

SUMMARY OF THE INVENTION

In order to overcome the above-mentioned disadvantages, one major objective in accordance with the present invention is provided for a modified encapsulation process method of wafer-level light-emitting diode dies. The disclosed encapsulation process method can be applied to the transfer process of vertical light emitting diode dies, and furthermore, can even be applied to its mass-transfer process when a great number of vertical light-emitting diode dies are expected to be transferred. Therefore, the present invention achieves in meeting the mass-transfer technical requirements of the related industries in a rapid and optimal efficiency.

It is noted that the disclosed process method and its performing steps are not limited to the mass-transfer process of vertical light emitting diode dies. According to the technical contents provided by the present invention, the disclosed process method may alternatively be applied to any mass-transfer process of various crystal dies or grains. Many alternatives and modifications will be apparent to those skilled in the art, once informed by the present disclosure, and thus still fall into the claim scope of the present invention.

By adopting the technical contents of the present invention, the conventional carrier board which was necessary to be used in the prior arts when performing the mass-transfer process for die package structures can be omitted. Therefore, the process steps and process cost for packaging and encapsulating the light emitting diode die structures can be accordingly reduced. And at the same time, since no damages will be formed to the die package structure, the packaging yield of light emitting diode die structures is thus believed to be optimized as well.

And moreover, another major objective in accordance with the present invention is to provide for an encapsulation process method for wafer-level light-emitting diode die package structures. The proposed process method is aimed to directly perform the die packaging process and color conversion process on its wafer structure, and to transfer the die package structures to the target substrate after the encapsulation is done. In view of such technical steps, the present invention is able to directly package a plurality of light-emitting diode dies in one time. And as a result, the present invention can effectively save the complex process steps in the prior art, in which each of the light-emitting diode die had to be transferred to the carrier board one by one repeatedly for performing packaging. And therefore, when the present invention is applied to a mass-transfer process of light-emitting diode dies, it is believed that the present invention is advantageous of saving the cost of time-consuming and labor-intensive operations as required in the prior arts, thereby complying with the needs of the industries for rapid and massive transfer.

For achieving the above-mentioned objectives, the Applicants of the present invention disclose an encapsulation process method for wafer-level light-emitting diode dies. The disclosed encapsulation process method includes a plurality of following steps:

(A) A wafer structure is provided, and a plurality of light-emitting diode dies are disposed on the wafer structure.

(B) The wafer structure having the plurality of light-emitting diode dies thereon is adhered to a temporary substrate, wherein each of the plurality of light-emitting diode dies includes a pad and a laser protectant is disposed on the pad.

(C) A laser cutting process is performed, such that a plurality of cutting lines is formed between the plurality of light-emitting diode dies, and the plurality of light-emitting diode dies are separated by a plurality of die areas through the plurality of cutting lines.

(D) A laser punch-through process is then performed, according to each of the plurality of die areas such that one of the plurality of light-emitting diode dies in each of the plurality of die areas becomes an electrical conductor.

(E) Subsequently, the laser protectant is removed, and a filler adhesive is provided to fill the plurality of cutting lines, and after that, a transparent conductive film is then sputtered on upper surfaces of the plurality of light-emitting diode dies. According to one embodiment of the present invention, said filler adhesive, for instance, can be made of epoxy resin or silicone. The transparent conductive film, for instance, can be made of indium tin oxide (ITO).

(F) And then, a color conversion process is performed such that the plurality of light-emitting diode dies are turned to have different luminous color scales.

(G) A wheel cutting process is subsequently performed to divide the plurality of light-emitting diode dies having different luminous color scales into a plurality of light-emitting diode packages.

(H) And finally, the wafer structure having the plurality of light-emitting diode packages thereon is separated from the temporary substrate and is transferred to a target substrate.

According to the embodiment of the present invention, said wafer structure may comprise a nickel-iron alloy (Invar) layer and a copper layer which is disposed on an upper surface and a lower surface of the nickel-iron alloy layer. The plurality of light-emitting diode dies disposed on the wafer structure have an original luminous color, such that the plurality of light-emitting diode dies can be illustrated as blue light-emitting diode dies.

In addition, said temporary substrate used in one embodiment of the present invention can be a sapphire substrate. And a water glue can be used for adhering the wafer structure to the temporary substrate. Under such a circumstance, when the above-mentioned (H) step is performed to separate the wafer structure and the temporary substrate, a glue removal process can be adopted to separate the wafer structure from the temporary substrate. To be specific, such glue removal process, for example, can be performed in a deionized water, and a process temperature of the deionized water can be preferably controlled at 50° C. Moreover, regarding the glue removal process, a glue removing film can be further provided on the plurality of light-emitting diode packages, and the wafer structure having the plurality of light-emitting diode packages and the glue removing film, the water glue and the temporary substrate are disposed in the deionized water such that the water glue is hydrolyzed and removed by the glue removal process. And as a result, the wafer structure and the temporary substrate can be separated.

Additionally, before transferring the plurality of light-emitting diode packages to the target substrate, an UV unstickiness process can be further used to make the glue removing film become nonadhesive. As such, after transferring the plurality of light-emitting diode packages to the target substrate, the glue removing film can be peeled off and removed.

According to one embodiment of the present invention, the water glue used in the invention may be preferably made of UV curable water glue. And by utilizing such UV curable water glue, the present invention is advantageous of using a relatively simple and less-complicated glue removal process to remove the water glue. In another aspect, the target substrate which the plurality of light-emitting diode packages are transferred to, can be a printed circuit board (PCB) according to one embodiment of the present invention.

And furthermore, regarding the above-mentioned (F) step when the color conversion process is performed, it is aimed to turn the original light-emitting diode dies (emitting blue lights) to have different luminous color scales. In such color conversion process, a plurality of black matrix (BM) photoresist is firstly disposed on the plurality of light-emitting diode dies; and after that, at least one quantum dot color filter (QDCF) may be further disposed between the plurality of black matrix photoresist such that the plurality of light-emitting diode dies can be controlled to have different luminous color scales.

According to one exemplary embodiment of the present invention, the plurality of light-emitting diode dies after the color conversion process is complete, can be controlled and turned into at least red light-emitting diode dies (emitting red lights) and green light-emitting diode dies (emitting green lights).

As such, it is believed that when applying the disclosed encapsulation process method for wafer-level light-emitting diode dies of the present invention, it is practical to package structures of vertical light emitting diode dies, and the light-emitting diode packages are package structures of vertical light emitting diode dies selected from a group consisting of a red light emitting diode die, a blue light emitting diode die and a green light emitting diode die. However, it should also be noted that the present invention is certainly not limited to such wavelength range of light emitting diode dies (emitting red, blue or green lights). According to variant embodiments of the invention, the vertical light emitting diode dies may also be composed as LED dies having various colors, or LED dies which emit white lights (visible lights) according to different preset wavelength bands. As a result, it is believed that the technical solutions disclosed in the present invention can be further widely applied, and not limited by the disclosed embodiment of the present invention.

As a result, it should be apparent that when those skilled in the art are acknowledged with the technical solutions disclosed in the present invention and adopt the proposed encapsulation process method for wafer-level light-emitting diode dies, it successfully eliminates the existing issues and deficiencies in the current technologies. Therefore, it can be obvious that the present invention is provided to effectively reduce the excessive cost and process steps in the existing mass-transfer process. As such, when compared to the current existing technologies, the present invention is certainly characterized by not only having great industrial applicability and technical competitiveness, but also being widely applied in any other related technical fields for mass-transfer processes and optimizing its process yield. Meanwhile, since the present invention is also characterized by the above-mentioned (D) step when performing a laser punch-though process, the light-emitting diode die in each of the die areas can be conductive and forms leakage such that the light-emitting diode die becomes an electrical conductor. By generating such electrical conductor, it effectively replaces the external wire bonding process to be used in the current technologies. Therefore, even with the miniaturization of die grain size nowadays, the present invention is still able to meet the miniaturized packaging requirements, and at the same time, optimize the packaging yield of light-emitting diode die grains. To sum above, it is apparently obvious that the present invention indeed is beneficial to show great industrial applicability and technical competitiveness in the arts as well as any other related technical fields.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 1 schematically shows a process flow chart illustrating the steps of the proposed encapsulation process method for wafer-level light-emitting diode dies in accordance with one embodiment of the present invention.

DESCRIPTION OF THE PREFERRED EMBODIMENTS

Figure 2:
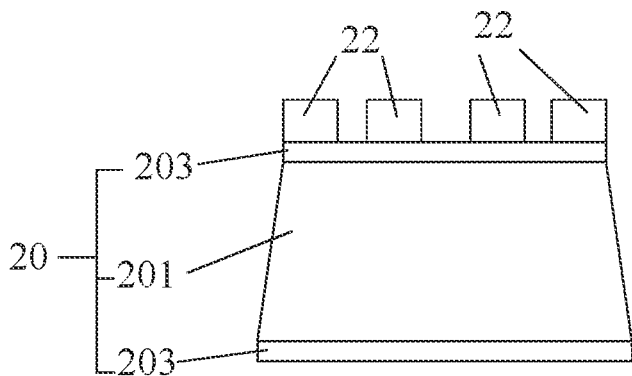
FIG. 2 schematically shows a structural diagram of a plurality of light-emitting diode dies being disposed on the wafer structure in accordance with the embodiment of the present invention.

It is to be understood that both the foregoing general description and the following detailed description are exemplary and are intended to provide further explanation of the invention as claimed. And references will now be made in detail to the preferred embodiments of the present invention, examples of which are illustrated in the accompanying drawings. Wherever possible, the same reference numbers are used in the drawings and the description to refer to the same or like parts. It is worth noticing that the embodiments described below are illustrated to demonstrate the technical contents and characteristics of the present invention and to enable the persons skilled in the art to understand, make, and use the present invention. However, it shall also be noticed that, it is not intended to limit the scope of the present invention. Therefore, any equivalent modification or variation according to the spirit of the present invention is to be also included within the scope of the present invention.

In the following paragraphs, the present invention is aimed to provide an encapsulation process method for wafer-level light-emitting diode dies without using a conventional carrier board. By employing the disclosed process method, it effectively achieves to implement the packaging encapsulation process of the light-emitting diode dies as required, before transferring the light-emitting diode dies to their target substrate. Therefore, the conventional carrier board used in the current technologies can be omitted and avoided. The disclosed encapsulation process method provided by the present invention can be applicable to the existing vertical-type light-emitting diode die structures such that a great number of light-emitting diode dies can be packaged and encapsulated in one time. As a result, it is apparent that when applying the present invention, it is no longer to package a single die one by one like it was in the prior arts, and thus the conventional packaging process cost can be significantly reduced, meanwhile improving the packaging yield of the light-emitting diode dies by employing the disclosed process method of the present invention.

Hereinafter, the encapsulation process method for wafer-level light-emitting diode dies disclosed by the Applicants may also be applied to any various related technical frameworks, and the present invention is certainly not limited to the following embodiments.

Please refer to FIG. 1 first, which schematically shows a process flow chart illustrating the steps of the proposed encapsulation process method for wafer-level light-emitting diode dies in accordance with one embodiment of the present invention. According to the disclosed process method, it mainly includes a plurality of following process steps as illustrated in FIG. 1.

Step S102: In the beginning, a wafer structure is provided, and a plurality of light-emitting diode dies are disposed on the wafer structure.

Step S104: Next, the wafer structure having the plurality of light-emitting diode dies thereon is adhered to a temporary substrate, wherein each of the plurality of light-emitting diode dies includes a pad and a laser protectant is disposed on the pad.

Step S106: And then, a laser cutting process is performed, such that a plurality of cutting lines is formed between the plurality of light-emitting diode dies, and the plurality of light-emitting diode dies are separated by a plurality of die areas through the plurality of cutting lines.

Step S108: Afterwards, a laser punch-through process is performed according to each of the plurality of die areas such that one of the plurality of light-emitting diode dies in each of the plurality of die areas is conductive and becomes an electrical conductor.

Step S110: The laser protectant is then removed, and a filler adhesive is then provided to fill the above-mentioned plurality of cutting lines. After that, a transparent conductive film is sputtered on upper surfaces of the plurality of light-emitting diode dies.

Step S112: Subsequently, a color conversion process is performed, such that the plurality of light-emitting diode dies are converted to have different luminous color scales.

Step S114: After the color conversion process, a wheel cutting process is performed to divide the plurality of light-emitting diode dies having different luminous color scales into a plurality of light-emitting diode packages.

Step S116: And at last, it is time to separate the wafer structure having the plurality of light-emitting diode packages thereon from the temporary substrate, and the wafer structure having the plurality of light-emitting diode packages thereon can be transferred to a target substrate.

Before going deeper into the detailed technical contents of the disclosed process method, and to enable those skilled in the art to have better understandings of the process steps disclosed in the present invention, please also refer to the accompanying structures and their component symbols as illustrated in FIG. 2 to FIG. 20. The present invention is hereby provided in detail as follows.

At first, please refer to FIG. 2, which schematically shows a structural diagram as described in Step S102 of the disclosed embodiment of the present invention. As can be seen, the wafer structure 20 includes a nickel-iron alloy (also known as Invar) layer 201 and a copper (Cu) layer 203 which is disposed on an upper surface and a lower surface of the nickel-iron alloy layer 201. According to the embodiment of the present invention, the material of the nickel-iron alloy layer 201 is a nickel-iron alloy, for example, having a nickel content of 36%. In addition, since the nickel-iron alloy layer 201 and the copper (Cu) layer 203 disclosed by the present invention can be combined through cutting, vacuum heating, and grinding or polishing to form the wafer structure 20, the formed wafer structure 20 is able to be characterized by not only a high thermal conductivity and low thermal expansion coefficient, but also a superior initial magnetic permeability. Accordingly, as compared to the other conventional metal substrates, the production cost of such magnetic wafer structure 20 can be much lower, and the thickness is thinner as well. As a result, it indeed offers as a new type of substrate having extremely low thermal expansion coefficient, high thermal conductivity, low production cost, and high yield without the need of any additional thinning process. In addition, such novel magnetic wafer structure is also easy to be bonded with an epitaxial layer.

A plurality of light-emitting diode dies 22 are disposed on the wafer structure 20. According to the embodiment of the present invention, the plurality of light-emitting diode dies 22, for instance, can be vertical-type structure light-emitting diode dies and have an original luminous color. Accordingly, in the embodiment of the invention, the light-emitting diode dies 22 can be blue light-emitting diode dies.

Figure 3:
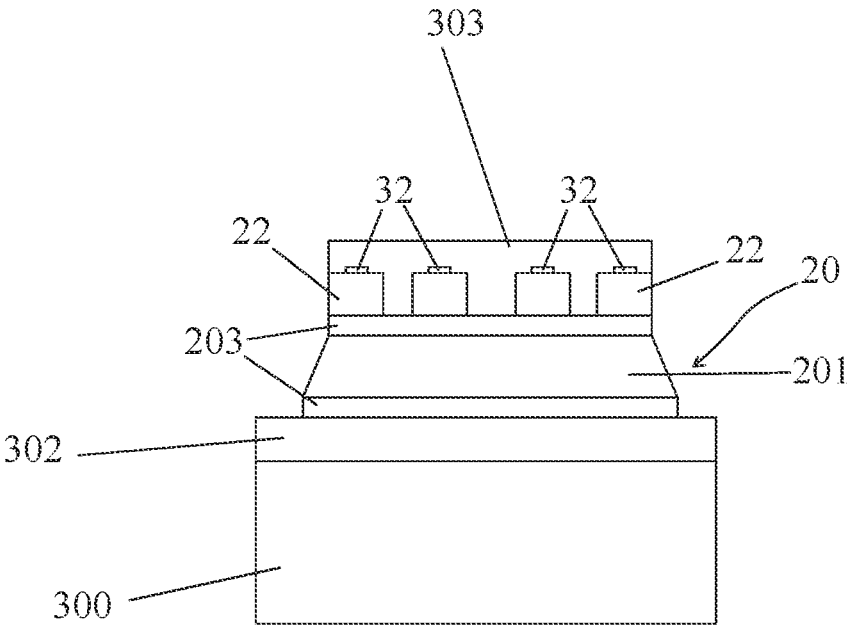
FIG. 3 schematically shows a structural diagram of further disposing a laser protectant thereon according to FIG. 2.

Later, as described in the step S104, please also find illustrations in FIG. 3 of the present invention. The wafer structure 20 having the plurality of light-emitting diode dies 22 thereon is adhered to a temporary substrate 300. According to the embodiment of the present invention, a water glue 302, for example, may be used for adhering the wafer structure 20 to the temporary substrate 300. In general, a feasible option for implementation of the temporary substrate 300 can be a sapphire substrate.

It can also be seen that, each of the plurality of light-emitting diode dies 22 includes a pad 32, and a laser protectant 303 is further disposed on the pad 32 such that a subsequent laser cutting process can be carried out in the next step S106.

Figure 4:
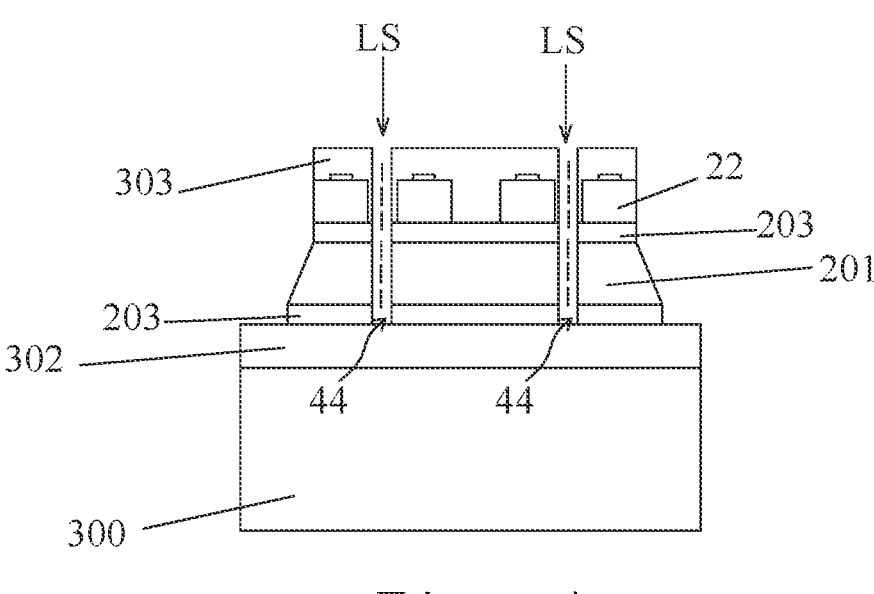
FIG. 4 schematically shows a cross sectional diagram of further performing a laser cutting process according to FIG. 3.
Figure 5:
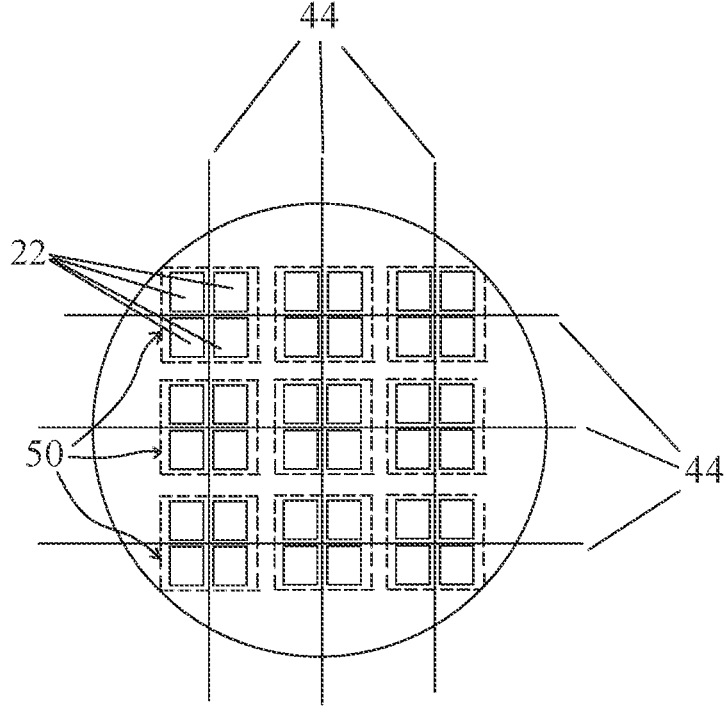
FIG. 5 schematically shows a top-view structural schematic diagram corresponding to FIG. 4.

FIG. 4 and FIG. 5 respectively disclose a cross-sectional structural schematic diagram as well as a top-view structural schematic diagram according to the laser cutting process LS as described in step S106 of the present invention. Overall, the present invention is aimed to form a plurality of cutting lines 44 between the plurality of light-emitting diode dies 22 by employing the laser cutting process LS, and therefore through the plurality of cutting lines 44, the plurality of light-emitting diode dies 22 can be separated by a plurality of die areas 50 (as indicated in FIG. 5).

Figure 6:
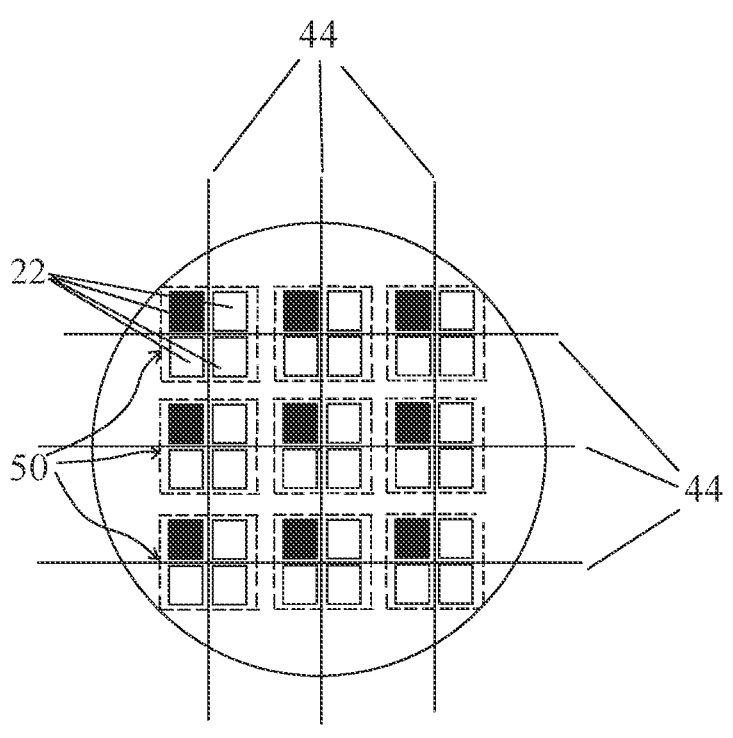
FIG. 6 schematically shows a structural diagram of further performing a laser punch-through process according to FIG. 5.
Figure 7:
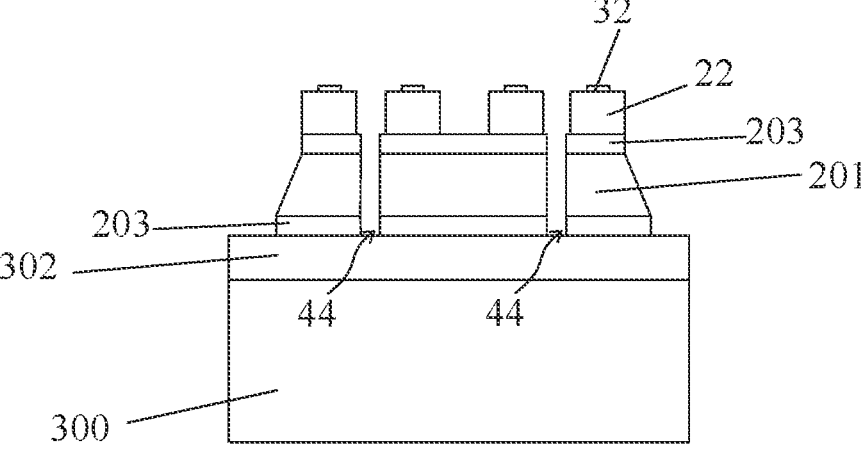
FIG. 7 schematically shows a structural diagram according to FIG. 4, after the laser protectant is removed.

And subsequently, please refer to FIG. 6, the present invention proceeds to implement the step S108, in which a laser punch-through process is performed according to each of the plurality of die areas 50, such that by performing the laser punch-through process, at least one of the plurality of light-emitting diode dies 22 in each of the plurality of die areas 50 becomes an electrical conductor (being conductive). Generally speaking, according to one technical solution of the present invention, the original light-emitting diode die 22 before the laser punch-through process is a semiconductor. Nevertheless, after performing the laser punch-through process in step S108, the light-emitting diode die 22 starts to form leakage such that the electrical conductor is formed and being conductive. According to one embodiment of the present invention, the laser punch-through process is a certain process in which an instantaneous high temperature can be attained in its shortly heating time. In general, according to common knowledge and experience in this field, the temperature at which the light-emitting diode die 22 can be punched through, for example, can be an instantaneous high temperature under the condition of approximately 35% to 50% of the power of a 10 W laser source. Among them, according to the embodiment of the present invention, the purpose of performing such laser punch-through process is to turn the original light-emitting diode die 22 from a semiconductor status into a conductive status, so as to provide electrical conduction.

To be more specific, according to one preferred embodiment of the present invention, the above mentioned laser punch-through process is preferably to be performed, in order to make one of the plurality of light-emitting diode dies 22 in each of the plurality of die areas 50 having a same position form leakage, such that the electrical conductor is formed. For example, in view of the perspective of the embodiment as shown in FIG. 6 of the present invention, then the laser punch-through process is aimed to make the light-emitting diode die 22 arranged in the upper left corner of each die area 50 form leakage and becomes an electrical conductor. However, it is also noted that the present invention is certainly not limited thereby such embodiment. In some other applicable embodiments of the present invention, the light-emitting diode die 22 to be punched through may also be arranged in other position of the die area 50. Nevertheless, it should be noted that the light-emitting diode die 22 that is punched through to form leakage and become conductive should be placed in a consistent position of each die area, but not randomly in order to maintain consistency.

Figure 8:
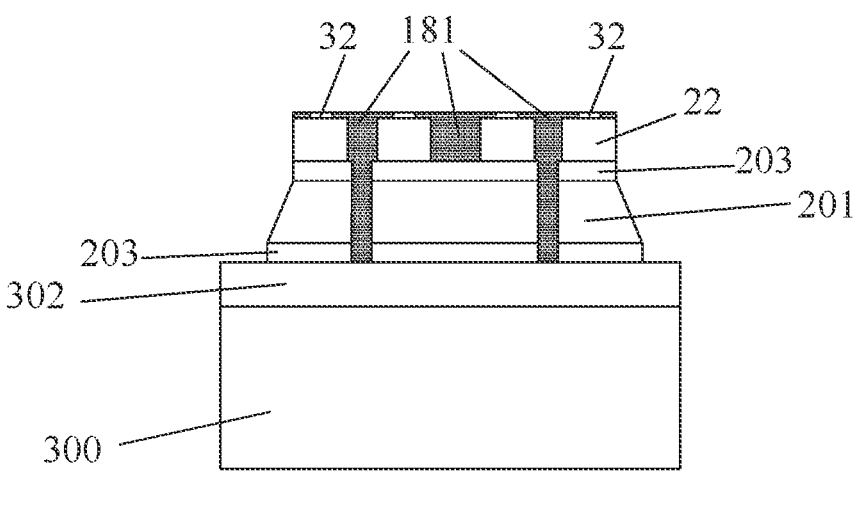
FIG. 8 schematically shows a structural diagram according to FIG. 7, after a filler adhesive is used to fill the cutting lines.
Figure 9:
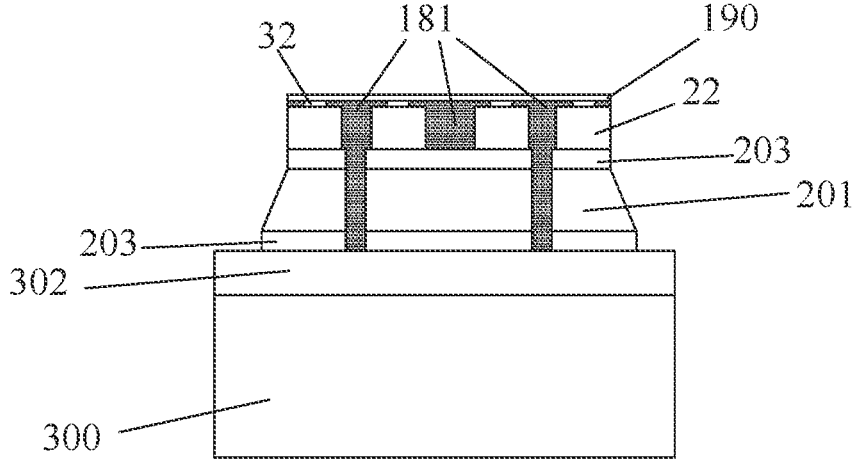
FIG. 9 schematically shows a structural diagram according to FIG. 8, after a transparent conductive film is further sputtered on upper surfaces of the plurality of light-emitting diode dies.

And afterwards, as described in step S110, the present invention proceeds to remove the previously used laser protectant 303 (in FIG. 7), and uses a filler adhesive 181 in FIG. 8 to fill the earlier cutting lines 44. And after that, as shown in FIG. 9, a transparent conductive film 190 can be sputtered on upper surfaces of the plurality of light-emitting diode dies 22. According to the embodiment of the present invention, the transparent conductive film 190, can be preferably made of indium tin oxide (ITO). In general, indium tin oxide is a mixture of indium oxide and tin oxide, usually with a mass ratio of 90% indium oxide ($In_2O_3$) plus 10% tin oxide ($SnO_2$). Overall, due to the improving evolution of the existing light-emitting diode process technologies, since the miniaturization of the die size is always pursued by most of the industries and thus the die size is much smaller than ever, it is evident that the size of the pad 32 on the light-emitting diode die will certainly be reduced as well. As a result, the post-end wire bonding in the subsequent manufacturing process will become extremely difficult to carry out. In view of solving such deficiencies, the present invention proposes the method of sputtering a transparent conductive film (ITO) 190 on the surface of the light-emitting diode die 22. As such, in this way, the wire bonding process used in the prior art can be effectively replaced.

In addition, in another aspect, according to the embodiment of the present invention, the previously described filler adhesive 181, for instance, can be made of epoxy resin or silicone. And moreover, in order to increase the visual contrast after die packaging encapsulation, then the material of the filler adhesive 181 can be further preferably made of silicone or epoxy resin in a black color.

Figure 10:
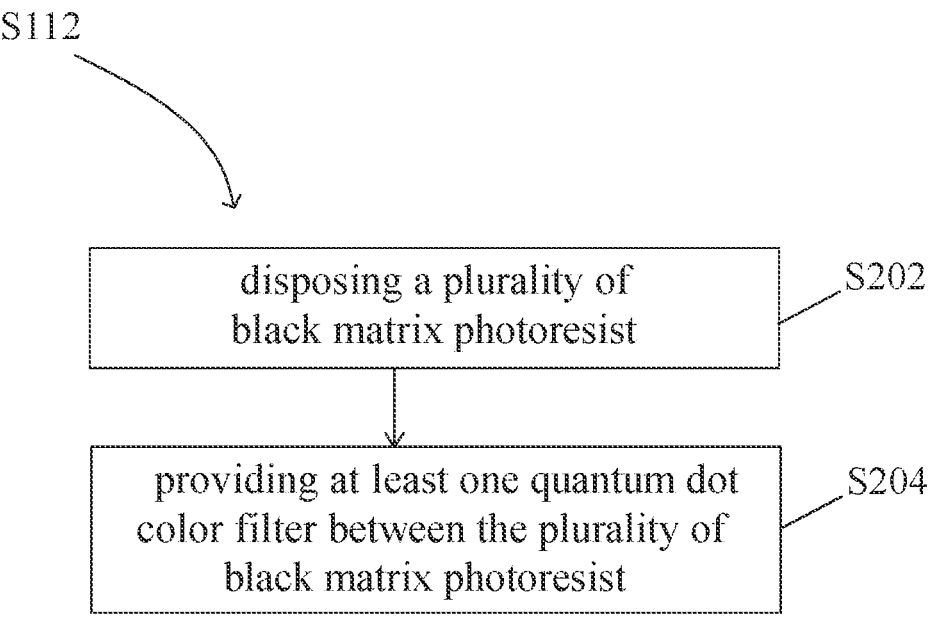
FIG. 10 schematically shows a process flow chart illustrating the steps of the proposed color conversion process disclosed in step S112 in FIG. 1 of the present invention.

In the following, after the transparent conductive film 190 is sputtered to replace the wire bonding process used in the prior arts, the present invention proceeds to perform the color conversion process in step S112. According to the embodiment of the present invention, the detailed steps of such color conversion process are illustrated in FIG. 10. Overall, the present invention achieves to adopt the color conversion process in step S112 to make the light-emitting diode dies 22 having the original luminous color (blue color) turn to have different luminous color scales, such as red color and green color.

Figure 11:
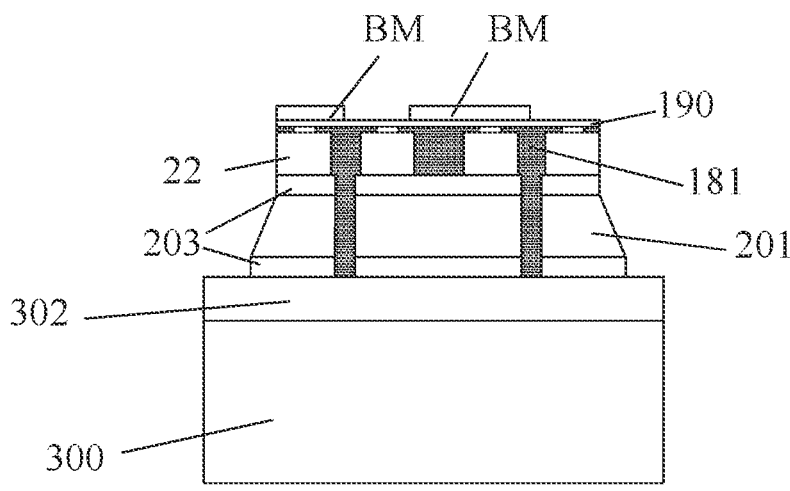
FIG. 11 schematically shows a structural diagram according to FIG. 9, after a plurality of black matrix photoresist are further provided and disposed on the transparent conductive film.
Figure 12:
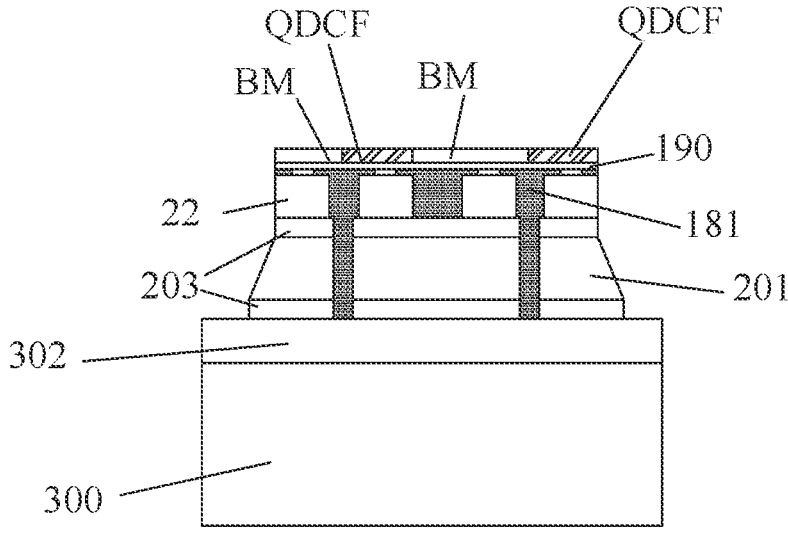
FIG. 12 schematically shows a structural diagram according to FIG. 11, after at least one quantum dot color filter is further provided and disposed between the plurality of black matrix photoresist.
Figure 13:
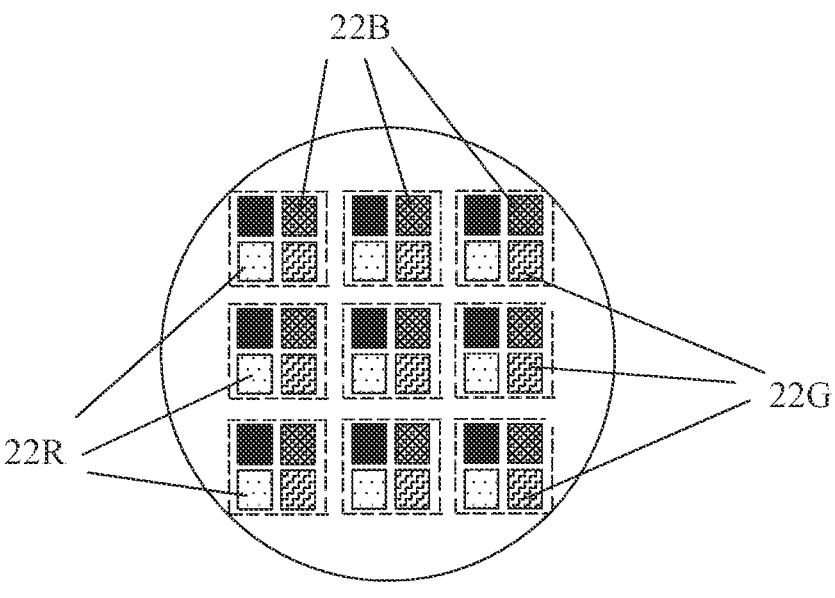
FIG. 13 schematically shows a diagram indicating that the blue light-emitting diode dies, the red light-emitting diode dies and the green light-emitting diode dies are formed after the color conversion process is complete in accordance with the embodiment of the present invention.
Figure 14:
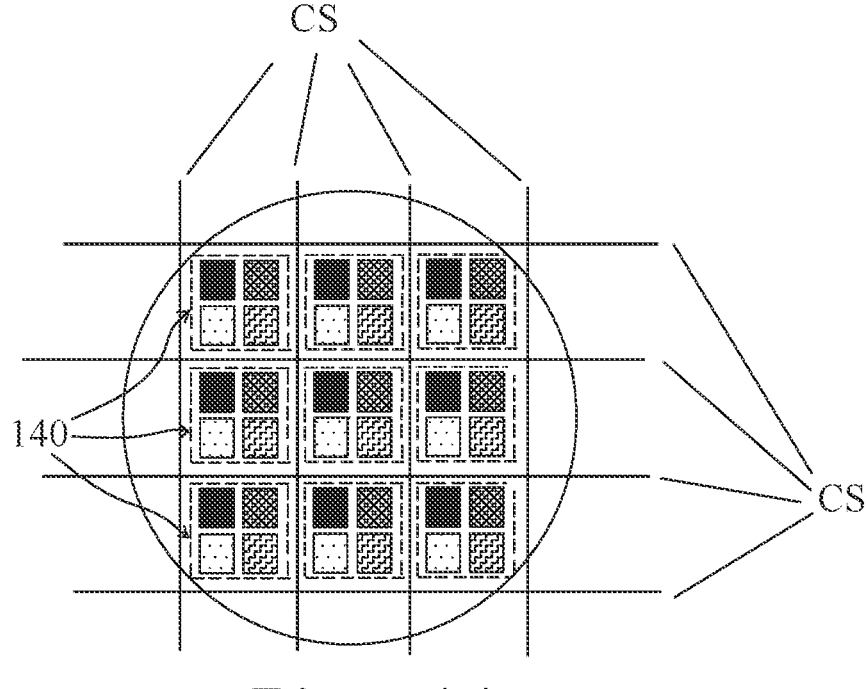
FIG. 14 schematically shows a top-view structural schematic diagram according to FIG. 13, after a wheel cutting process is further performed to divide the plurality of light-emitting diode dies into a plurality of light-emitting diode packages.

In specific, as shown in FIG. 10, the color conversion process disclosed in step S112 of FIG. 1 of the present invention mainly comprises the steps of S202 and S204. At first, in step S202, at least one black matrix photoresist is provided, and FIG. 11 schematically shows the corresponding structural diagram. As can be seen, a plurality of black matrix photoresist BM are provided and disposed on the transparent conductive film 190 on the plurality of light-emitting diode dies 22. And after that, as described in step S204, the present invention may further provide at least one quantum dot color filter QDCF between the plurality of black matrix photoresist BM, such that the plurality of light-emitting diode dies can be formed and have different luminous color scales, for example, red color and green color.

In general, the use of the black matrix photoresist BM can be widely applied for blocking the light source of the display panel that needs to be shielded based on its high light resisting properties. In one embodiment, the black matrix photoresist BM is usually a vacuum-plated metal film, and the required pattern can be obtained by employing a lithography etching process. Such black matrix photoresist BM can not only be used to isolate the red color (R), the blue color (B) and the green color (G) and improve contrast, it is also advantageous of providing benefits, including high precision, low defect, high optical density, and excellent weathering resistance. As a result, it is believed that the black matrix photoresist BM can be widely used in optics, micro-projection packaging, or optical wafer-level packaging, etc. On the other hand, the quantum dot color filter QDCF is mostly design in a sandwiched structure, in which the upper and lower surfaces of the quantum dot layer are covered with a water-oxygen barrier film. When it is combined with the blue light-emitting diode dies, the red, green, and blue light sources with sharp peaks can be generated, thereby effectively improving the displayed color in subsequent product applications (e.g.: LCD displays). Due to such technical features, by employing and disposing the black matrix photoresist BM and the quantum dot color filter QDCF on the upper surfaces of the plurality of light-emitting diode dies, the color conversion process as provided in step S112 can be accomplished, such that the disclosed light-emitting diode dies in the present invention are formed and turned into light-emitting diode dies having different luminous color scales. Please refer to FIG. 13, in which it is obvious that after the color conversion process is performed in step S112, the light-emitting diode dies can be turned to become the blue light-emitting diode dies 22B, which emit blue lights, the red light-emitting diode dies 22R, which emit red lights, and the green light-emitting diode dies 22G, which emit green lights.

Figure 15:
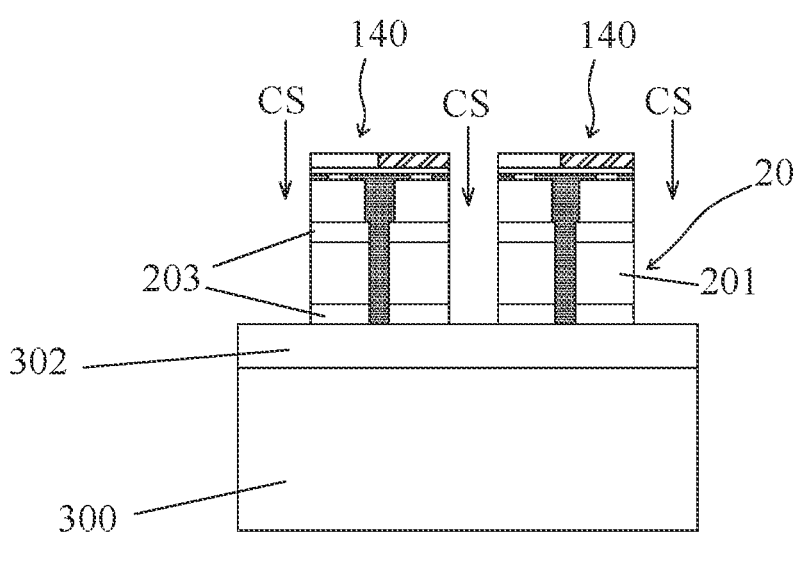
FIG. 15 schematically shows a cross sectional structural schematic diagram according to FIG. 12, after a wheel cutting process is further performed to divide the plurality of light-emitting diode dies into a plurality of light-emitting diode packages.
Figure 16:
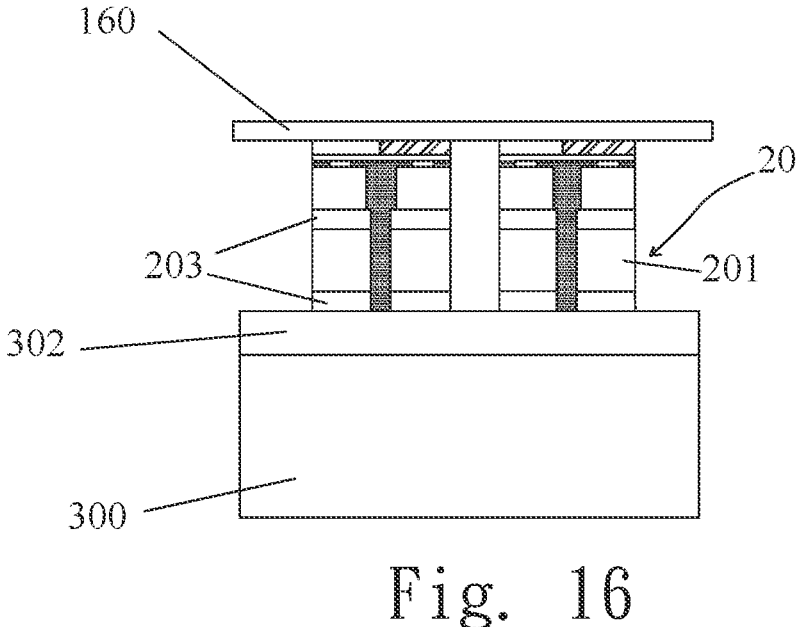
FIG. 16 schematically shows a structural diagram according to FIG. 15, after a glue removing film is further provided on the plurality of light-emitting diode packages.

After the color conversion process is complete, the present invention is able to proceed the following step S114 in FIG. 1 such that the plurality of light-emitting diode dies having different luminous color scales can be divided into a plurality of light-emitting diode packages 140 (refer to FIG. 14) by performing the wheel cutting process CS. FIG. 15 schematically shows the cross-sectional structure diagram of the plurality of light-emitting diode packages 140 after the wheel cutting process CS is performed. As can be seen, at this time, the packaging and encapsulation process of the light-emitting diode dies has been completed on the wafer structure 20, and also been cut into the plurality of light-emitting diode packages 140 as shown in the figure.

And therefore, in the final step as shown in step S116 in FIG. 1, since the packaging and encapsulation process of the light-emitting diode dies has been completed, the present invention proceeds to separate the wafer structure 20 having the plurality of light-emitting diode packages 140 thereon from the previous temporary substrate 300. And, the wafer structure 20 having the plurality of light-emitting diode packages 140 thereon can be transferred to a target substrate.

To be more specific, according to one preferred embodiment of the present invention, when the water glue 302 is used for adhering the wafer structure 20 to the temporary substrate 300, then a glue removal process (see FIG. 16 to FIG. 18) can be used to remove the water glue 302 such that the wafer structure 20 having the plurality of light-emitting diode packages 140 thereon and the temporary substrate 300 can be separated.

Regarding such glue removal process, it comprises providing a glue removing film 160 on the plurality of light-emitting diode packages 140, and after that, the wafer structure 20 having the plurality of light-emitting diode packages 140 and the glue removing film 160, the water glue 302 and the temporary substrate 300 are disposed in a deionized water 700 such that the water glue 302 can be hydrolyzed and removed by performing such glue removal process. As a result, it is to be expected that the wafer structure 20 and the temporary substrate 300 can be successfully separated. According to one embodiment of the present invention, the disclosed glue removal process can be determined and performed in a deionized water 700. And, a process temperature of the deionized water 700 can be controlled, for example, at 50° C.

Figure 17:
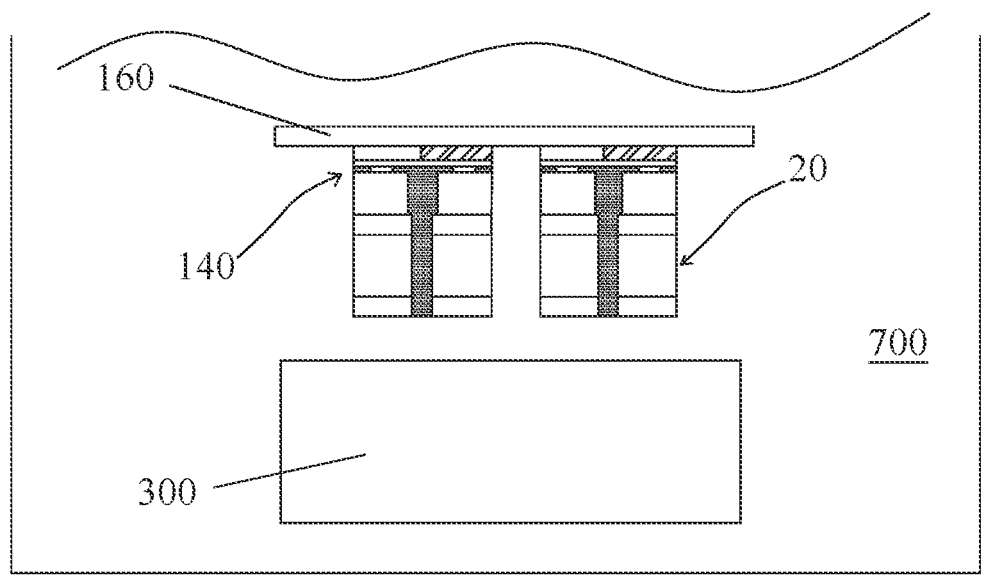
FIG. 17 schematically shows a structural diagram according to FIG. 16, when a glue removal process is performed in a deionized water.

In addition, according to the technical solution disclosed above by the present invention, such a glue removal process basically can be determined and performed base on the material of the water glue 302. In one preferable embodiment of the present invention, the water glue 302 to be used can be preferably, made of UV curable water glue. In general, when such UV curable water glue is adopted to adhere between the wafer structure 20 and the temporary substrate 300, the glue removal process to be performed, can be relatively simple. For instance, it is feasible for the practitioners to directly utilize the deionized water 700 as shown in FIG. 17 to hydrolyze the UV curable water glue and to remove it, under the condition of controlling a water temperature of the deionized water 700 at approximately 50 degrees Celsius. And yet, it is believed that these process parameters are merely one of the implementations of the present invention, which is not aimed to limit the claim scope of the present invention. Generally, in the field, for people having ordinary knowledge and technical backgrounds in the art, it is practicable to make variations and/or modifications as required, and therefore the present invention is not limited hereby the embodiments disclosed as above.

In view of the above mentioned technical contents disclosed by the present invention, it is apparent that no additional solvents or special glue removal equipment needs to be used, for the purpose of removing the water glue 302. And therefore, the present invention achieves to reduce and suppress the damage that these chemical solvents may cause to the substrate or the structure of the light-emitting diode packages 140 itself. Also, in addition, the huge process cost, and tedious procedures of additional glue removal equipment can be saved and omitted. From these points of views, it is obvious that the present invention can easily remove the water glue 302 under the advantages of relatively simple process and no damages to be done to the substrate or the light-emitting diode packages 140, which are also some of the inventive effects that the present invention is able to accomplish.

Figure 18:
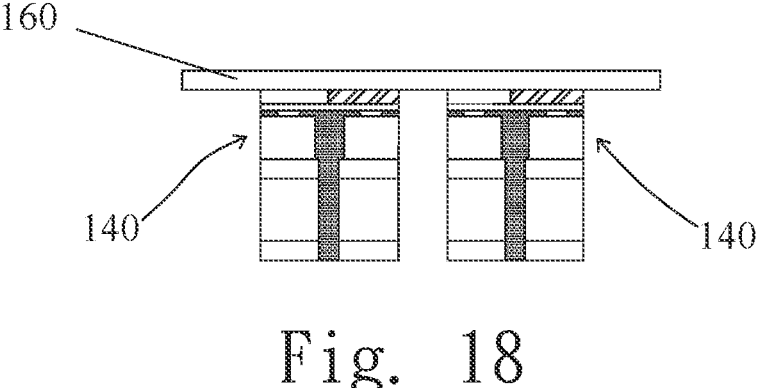
FIG. 18 schematically shows a structural diagram according to FIG. 17, after the water glue and the temporary substrate are removed.

As a result, please refer to FIG. 18, which schematically shows a structural diagram of the present invention after the previous described glue removal process is complete. At this time, it is apparent that the temporary substrate 300 is removed, and the light-emitting diode packages 140 can be subsequently transferred to a target substrate.

Figure 19:
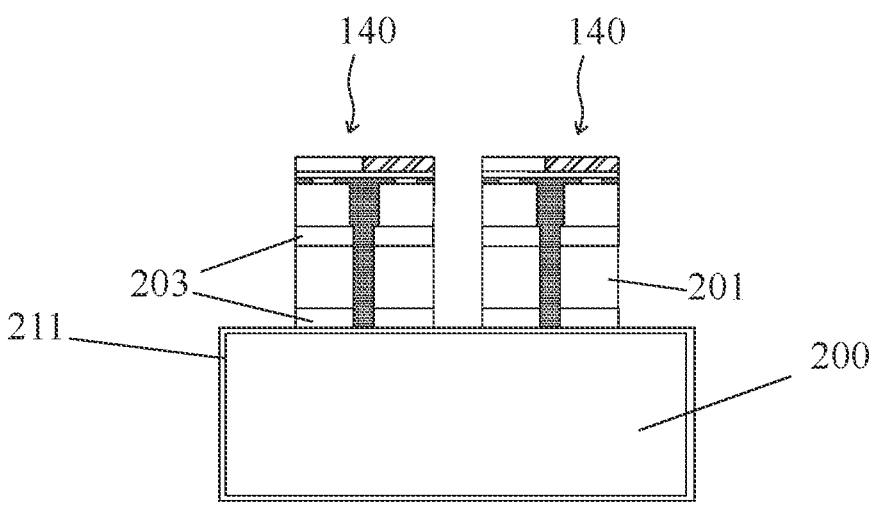
FIG. 19 schematically shows a structural diagram according to FIG. 18, after the light-emitting diode packages are finally transferred to a target substrate.

And before transferring to the target substrate, an UV unstickiness process may be further adopted to make the glue removing film 160 used in the glue removal process become nonadhesive. As a result, after transferring to the target substrate, the glue removing film 160 can be peeled off and removed. Please refer to FIG. 19 and FIG. 20, which respectively shows a cross-sectional view and a top view of the schematic structural diagram of the present invention after the light-emitting diode packages 140 are finally trans- ferred to a target substrate 200. In one embodiment, the target substrate 200 to be used, is generally a printed circuit board (PCB). Additionally, as illustrated in FIG. 19, when using such a printed circuit board as a target substrate, a metal material 211 may be further spray-printed or screen- printed around the printed circuit board (target substrate 200), and the material of such metal material 211 can be Tin, for example.

Figure 20:
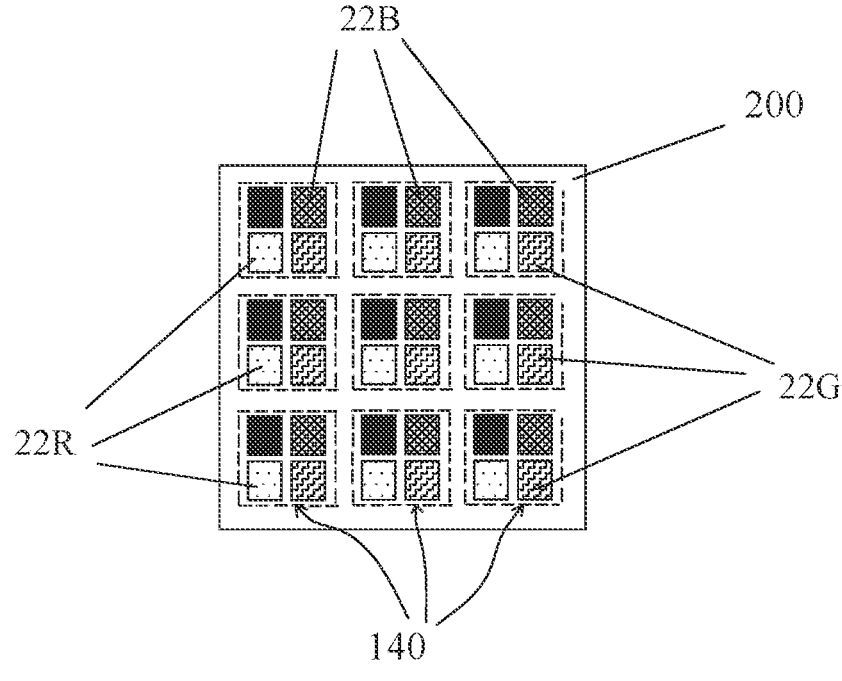
FIG. 20 discloses a final schematic diagram of the wafer-level light-emitting diode dies which are successfully transferred to the target substrate by employing the encapsulation process method provided by the present invention without using a conventional carrier board.

FIG. 20 discloses a final schematic diagram of the wafer- level light-emitting diode dies which are successfully trans- ferred to the target substrate 200 by employing the encap- sulation process method provided by the present invention without using a conventional carrier board. As shown in the figure, the plurality of light-emitting diode packages 140 are package structures of vertical light emitting diode dies. And the vertical light emitting diode dies contained in the plu- rality of light-emitting diode packages 140 can be selected from a group consisting of a red light emitting diode die, a blue light emitting diode die and a green light emitting diode die. In other words, as referring to FIG. 20, it is allowed that, the light emitting diode dies disclosed in the present inven- tion, are composed of the blue light-emitting diode dies 22B which emit blue lights, the red light-emitting diode dies 22R which emit red lights, and the green light-emitting diode dies 22G which emit green lights.

In view of the above descriptions, it is believed that the inventive spirit of the present invention is to propose an encapsulation process method that can directly package the vertical light-emitting diode dies in one time, without using the additional carrier board as required in the prior arts. Through these manners, mass transfer can be directly applied to the light-emitting diode packages in a large amount in the subsequent process, without the need to transfer one die by one die and repeatedly using a single die. The disclosed technical solutions can be adopted for further complying with the optimized benefits of industrial mass transfer requirements.

And moreover, according to the present invention, it further provides a laser punch-through process, in order to punch through the light-emitting diode die and form leak- age, such that the light-emitting diode die can be turned into an electrical conductor. In addition, by sputtering a trans- parent conductive film (ITO) on upper surfaces of the light-emitting diode dies, the present invention thus success- fully replaces the external wire bonding process used in the prior arts. As a result, it is believed that the present invention is able to successfully meet the packaging and encapsulation requirements of miniaturized-size vertical light-emitting diode dies in current technologies, and at the same time to optimize the packaging yield of the current vertical light- emitting diode dies.

Based on the above, it is apparent that the Applicants of the present invention disclose an encapsulation process method for wafer-level light-emitting diode dies without using a conventional carrier board. By employing the pres- ent invention, the packaging and encapsulation process can be directly performed to the wafer-level light-emitting diode dies without the use of any conventional redundant carrier boards. It has been well known that the prior arts may only make die and/or wafer transfer process one by one repeat- edly, and the packaging and encapsulation process can only be performed after the die and/or wafer transfer is complete.

In order to solve these shortcomings, the Applicants of the present invention propose the disclosed process method such that the whole light-emitting diode dies can be encapsulated and packaged completely, before being transferred to their target substrate. As a result, the present invention achieves to greatly reducing the conventional process cost, compli- cated procedures, and also process complexity of the prior packaging process steps, on account of the proposed process method disclosed by the present invention.

Apart from the above, according to the encapsulation process method for wafer-level light-emitting diode dies of the present invention, a rapid and mass-transfer result may also be accomplished when a plurality of die package structure is further sprayed and dispensed in large quantities at one time. Therefore, it is believed that the present inven- tion not only meets up with the requirement for rapidly mass transferring the current LED die structures, but also effec- tively enhance its competitiveness regarding industrial pro- duction. Under such circumstances, the present invention not only results in effectively improving the existing defi- ciencies in the prior arts, but also complies with the require- ments for die packaging and mass-transfer process even when the die size is getting microminiaturization nowadays. In addition, the packaging and encapsulation yield of the vertical light emitting diode die structures can be optimized, thereby realizing the superior effect of the present invention.

As a result, to sum up, according to the several embodi- ments and the technical contents disclosed by the present invention, it is believed that the disclosed encapsulation process method for wafer-level light-emitting diode dies of the present invention is applicable to vertical light emitting diode die package structures, and is beneficial to improve the existing packaging, wiring and mass-transferring process. By adopting such process method, as compared with the current technologies, it is believed that the present invention and process methods being proposed are able to effectively solve the issues existing in the prior arts and to provide much more superior process efficiency. In addition, the proposed process method of the present invention can be applied to not only general light emitting diode dies, but also any various related electronic circuit components in the semi- conductor industry, integrated circuit industry, or power electronics industry. In view of all, the Applicants assert that the present invention is instinct, effective and highly com- petitive for incoming technologies, industries and researches developed in the future. And since the technical features, means and effects achieved by the present invention are significantly different from the current solutions, and can not be accomplished easily by those who are familiar with the industry, it is thus believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the inven- tion and its equivalent.

What is claimed is:

1. An encapsulation process method for wafer-level light- emitting diode dies, comprising:
   providing a wafer structure, and disposing a plurality of light-emitting diode dies on the wafer structure;
   adhering the wafer structure having the plurality of light- emitting diode dies thereon to a temporary substrate, wherein each of the plurality of light-emitting diode dies includes a pad and a laser protectant is disposed on the pad;

performing a laser cutting process such that a plurality of cutting lines is formed between the plurality of light-emitting diode dies, and the plurality of light-emitting diode dies are separated by a plurality of die areas through the plurality of cutting lines;

performing a laser punch-through process according to each of the plurality of die areas such that one of the plurality of light-emitting diode dies in each of the plurality of die areas becomes an electrical conductor;

removing the laser protectant, and providing a filler adhesive to fill the plurality of cutting lines, and sputtering a transparent conductive film on upper surfaces of the plurality of light-emitting diode dies;

performing a color conversion process such that the plurality of light-emitting diode dies have different luminous color scales;

performing a wheel cutting process to divide the plurality of light-emitting diode dies having different luminous color scales into a plurality of light-emitting diode packages; and separating the wafer structure having the plurality of light-emitting diode packages thereon from the temporary substrate, and transferring the wafer structure having the plurality of light-emitting diode packages thereon to a target substrate.

2. The encapsulation process method for wafer-level light-emitting diode dies of claim 1, wherein a water glue is used for adhering the wafer structure to the temporary substrate.

3. The encapsulation process method for wafer-level light-emitting diode dies of claim 1, wherein the wafer structure comprises a nickel-iron alloy layer and a copper layer which is disposed on an upper surface and a lower surface of the nickel-iron alloy layer.

4. The encapsulation process method for wafer-level light-emitting diode dies of claim 1, wherein the temporary substrate is a sapphire substrate.

5. The encapsulation process method for wafer-level light-emitting diode dies of claim 1, wherein the laser punch-through process is performed to make one of the plurality of light-emitting diode dies in each of the plurality of die areas having a same position form leakage such that the electrical conductor is formed.

6. The encapsulation process method for wafer-level light-emitting diode dies of claim 1, wherein the filler adhesive is made of epoxy resin or silicone.

7. The encapsulation process method for wafer-level light-emitting diode dies of claim 1, wherein the transparent conductive film is made of indium tin oxide.

8. The encapsulation process method for wafer-level light-emitting diode dies of claim 1, wherein in the step of performing the color conversion process further comprises:

disposing a plurality of black matrix photoresist on the transparent conductive film on the plurality of light-emitting diode dies; and providing at least one quantum dot color filter between the plurality of black matrix photoresist such that the plurality of light-emitting diode dies have different luminous color scales.

9. The encapsulation process method for wafer-level light-emitting diode dies of claim 1, wherein the plurality of light-emitting diode dies have an original luminous color, such that the plurality of light-emitting diode dies are blue light-emitting diode dies.

10. The encapsulation process method for wafer-level light-emitting diode dies of claim 1, wherein after the color conversion process is performed, the plurality of light-emitting diode dies are turned into at least red light-emitting diode dies and green light-emitting diode dies.

11. The encapsulation process method for wafer-level light-emitting diode dies of claim 1, wherein when a water glue is used for adhering the wafer structure to the temporary substrate, a glue removal process is used to separate the wafer structure having the plurality of light-emitting diode packages thereon from the temporary substrate.

12. The encapsulation process method for wafer-level light-emitting diode dies of claim 11, wherein the glue removal process is performed in a deionized water.

13. The encapsulation process method for wafer-level light-emitting diode dies of claim 12, wherein a process temperature of the deionized water is controlled at 50° C.

14. The encapsulation process method for wafer-level light-emitting diode dies of claim 11, wherein the glue removal process comprises providing a glue removing film on the plurality of light-emitting diode packages, and disposing the wafer structure having the plurality of light-emitting diode packages and the glue removing film, the water glue and the temporary substrate in a deionized water such that the water glue is hydrolyzed and removed by the glue removal process and the wafer structure and the temporary substrate are separated.

15. The encapsulation process method for wafer-level light-emitting diode dies of claim 14, wherein before transferring to the target substrate, an UV unstickiness process is further used to make the glue removing film become non-adhesive.

16. The encapsulation process method for wafer-level light-emitting diode dies of claim 15, wherein after transferring to the target substrate, the glue removing film is peeled off.

17. The encapsulation process method for wafer-level light-emitting diode dies of claim 11, wherein the water glue is made of UV curable water glue.

18. The encapsulation process method for wafer-level light-emitting diode dies of claim 1, wherein the target substrate is a printed circuit board (PCB).

19. The encapsulation process method for wafer-level light-emitting diode dies of claim 1, wherein the plurality of light-emitting diode packages are package structures of vertical light emitting diode dies.

20. The encapsulation process method for wafer-level light-emitting diode dies of claim 19, wherein the vertical light emitting diode dies of the plurality of light-emitting diode packages are selected from a group consisting of a red light emitting diode die, a blue light emitting diode die and a green light emitting diode die.

* * * * *